United States Patent [19]
Lin

[11] Patent Number: 5,713,790
[45] Date of Patent: Feb. 3, 1998

[54] EMBEDDED HEAT DISSIPATING DEVICE MOUNTING STRUCTURE

[75] Inventor: Mao-Yu Lin, Taipei, Taiwan

[73] Assignee: Inventec Corporation, Taipei, Taiwan

[21] Appl. No.: 707,307

[22] Filed: Sep. 3, 1996

[51] Int. Cl.⁶ .................................................. H05K 7/20
[52] U.S. Cl. ........................ 454/184; 361/695; 415/213.1
[58] Field of Search .............................. 454/184; 361/695, 361/697; 415/213.1, 214.1; 416/247 R

[56] References Cited

U.S. PATENT DOCUMENTS

| | | | |
|---|---|---|---|
| 4,834,615 | 5/1989 | Mauch et al. | 415/213.1 |
| 5,042,269 | 8/1991 | Sullivan | 415/213.1 X |
| 5,208,730 | 5/1993 | Tracy . | |
| 5,495,392 | 2/1996 | Shen . | |

*Primary Examiner*—Harold Joyce
*Attorney, Agent, or Firm*—Jacobson, Price, Holman & Stern, PLLC

[57] ABSTRACT

An embedded heat dissipating device mounting structure including a housing for an electronic instrument, the housing having an opening and two parallel side boards perpendicularly raised from the periphery of the opening at two opposite sides, a heat dissipating device mounted in the opening of the housing and secured to the parallel side boards and operated to carry heat out of the housing, the heat dissipating device having a cover shell which has backward springy hooks adapted for hooking on the parallel side boards of the housing at an inner side, and elongated flanges adapted for stopping against the parallel side boards of the housing at an outer side.

7 Claims, 3 Drawing Sheets

EMBEDDED HEAT DISSIPATING DEVICE MOUNTING STRUCTURE

BACKGROUND OF THE INVENTION

The present invention relates to an embedded heat dissipating device mounting structure adapted for mounting a heat dissipating device in the housing of an electronic instrument for carrying heat out of the housing.

Regular electronic apparatus commonly comprise an enclosed housing to hold the respective electronic parts. When an electronic apparatus is operated, the internal electronic parts will generate heat. If heat is not quickly carried away, the performance of the internal electronic parts will be affected. Electric fans are commonly used for dissipating heat from electronic instruments. Because regular heat dissipating fans for this purpose are commonly mounted on the inside of the electronic instrument, the installation procedure is complicated, and heat cannot be efficiently carried out of the housing.

SUMMARY OF THE INVENTION

The present invention has been accomplished to provide an embedded heat dissipating device mounting structure for electronic instrument which eliminates the aforesaid drawbacks. According to one aspect of the present invention, the embedded heat dissipating device mounting structure comprises a housing which shelters an electronic instrument, having an opening and two parallel side boards perpendicularly raised from the opening at two opposite sides, and a heat dissipating device mounted in the opening of the housing and secured to the side boards of the housing by hooks thereof for carrying heat out of the housing efficiently. According to another aspect of the present invention, the heat dissipating device comprises a fan means controlled to cause currents of air for carrying heat out of the housing, a cover shell covered on the fan means, buffer elements adhered to the periphery of the fan means and stopped inside the cover shell to absorb shock waves and to eliminate noises, and cushions mounted in respective grooves at the front side of the fan and stopped against the front wall of the cover shell to absorb shock waves and to eliminate noises. According to still another aspect of the present invention, the cover shell comprises a front wall at the front side, a plurality of air vents through the front wall in alignment with the exhaust port of the fan, two opposite pairs of parallel side walls perpendicularly and backwardly raised from the border of the front wall, a plurality of springy backward hooks respectively formed in the parallel side walls and adapted for hooking on the side boards of the housing at the back side, and two elongated flanges respectively raised from the border the front wall at two opposite sides and adapted for stopping against the side boards of housing at the front side.

DETAILED DESCRIPTION OF THE PREFERRED EMBODIMENT

Figure 1:
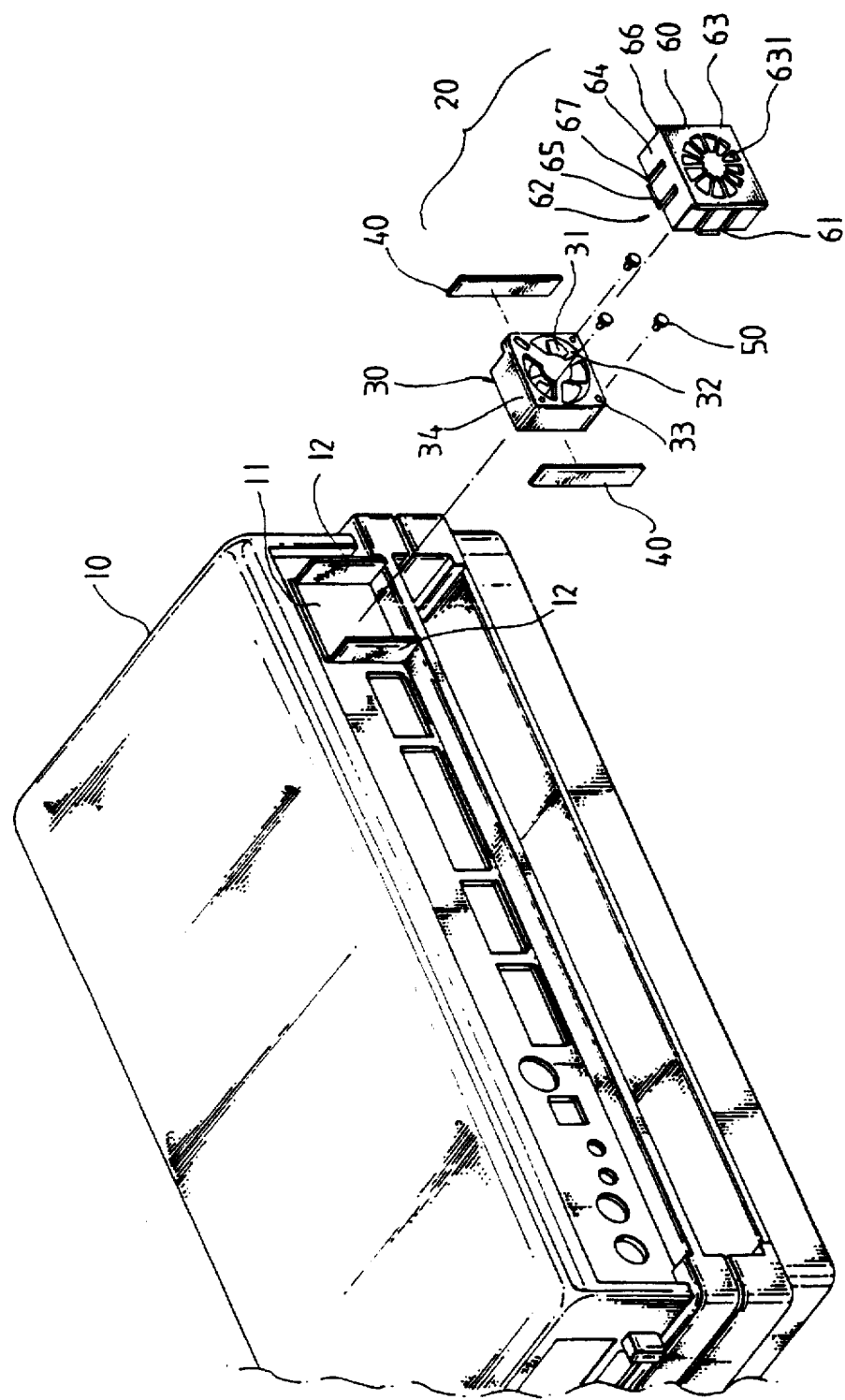
FIG. 1 is an exploded view of an embedded heat dissipating device mounting structure according to the present invention.

Referring to FIG. 1, an embedded heat dissipating device mounting structure in accordance with the present invention is generally comprised of a housing 10 which can be for example a docking station for a notebook computer, and a heat dissipating device 20. The housing 10 has an opening 11 in communication with the inside space of the housing, and two parallel side boards 12 perpendicularly and outwardly raised from two opposite sides of the opening 11.

The heat dissipating device 20 is mounted in the opening 11, comprised of a fan means 30, a buffer means 40, cushion means 50, and a cover shell 60. The fan means 30 comprises a casing 34 with a fan 31 pivotably mounted on the inside, and air passage holes 32 at two opposite sides of the box 34. At least one mounting groove 33 is located at the border of one side of the casing 34. The buffer means 40 is mounted around the periphery of the casing 34. In the embodiment shown in FIG. 1, the buffer means 40 is comprised of a plurality of glued rubber pads adhered to the periphery of the casing 34. The cushion means 50 is respectively mounted in the at least one mounting groove 33. In the embodiment shown in FIG. 1, the cushion means 50 is comprised of a plurality of rubber cushions, the number of the mounting groove 33 is equal to the number of the rubber cushions. The cover shell 60, comprises a receiving chamber 61 which receives the fan means 30, a back opening 62 at the back side in communication with the receiving chamber 61, a front wall 63 at the front side opposite to the opening 62, a plurality of air vents 631 through the front wall 63, two opposite pairs of parallel side walls 64 perpendicularly and backwardly raised from the border of the front wall 63, and two elongated flanges 66 respectively raised from the border the front wall 63 at two opposite sides for stopping against the parallel side boards 12 at an outer side. The size of the side walls 64 fits the side boards 12 of the housing 10. The side walls 64 have respective splits 67 defining a respective backward hook 65 for hooking on the periphery of the opening 11 of the housing 10.

Figure 2:
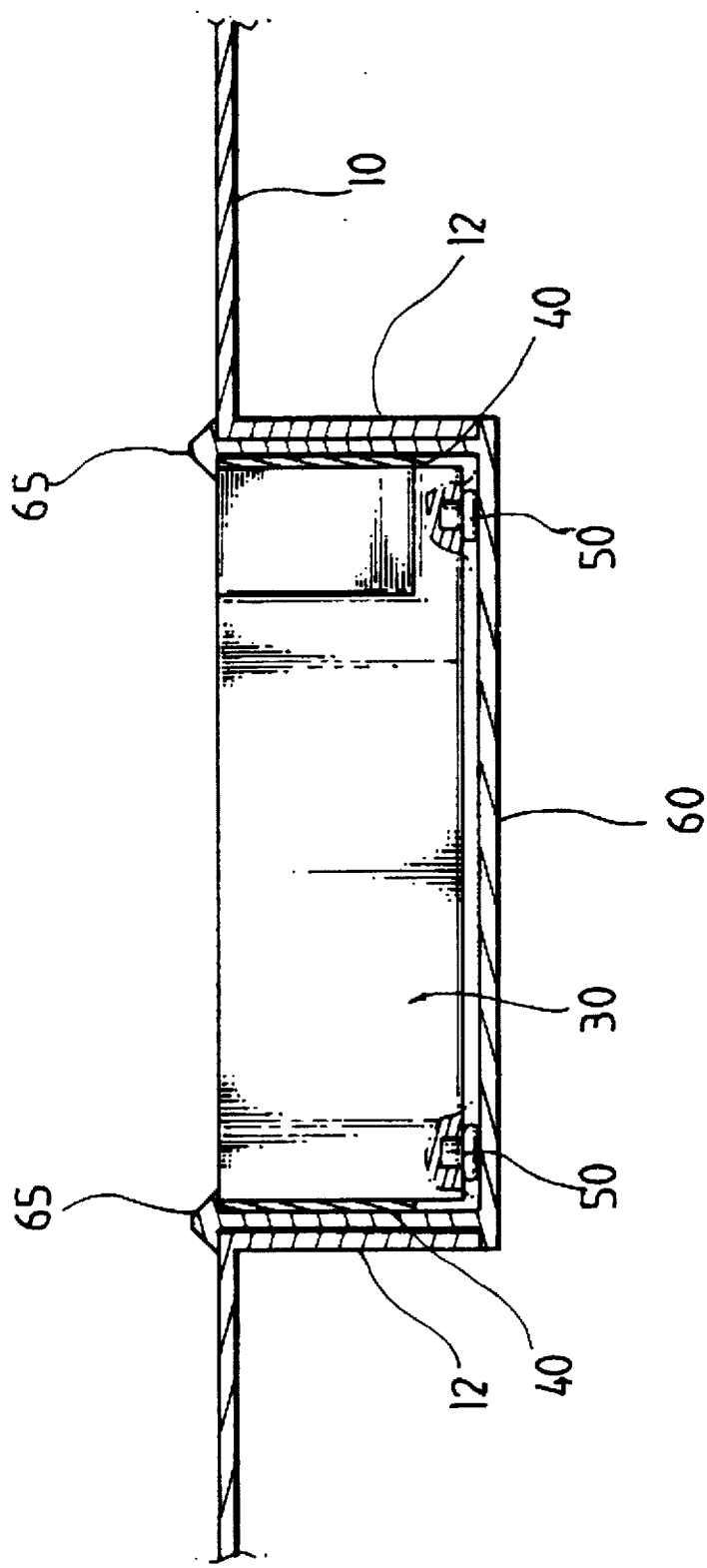
FIG. 2 is a sectional view of the present invention, showing the embedded heat dissipating device mounting structure installed.

Referring to FIG. 2, the cushion means 50 is mounted in the at least one mounting groove 33 of the fan means 30, then the buffer means 40 is adhered to the periphery of the casing 34 of the fan means, and then the casing 34 of the fan means is inserted through the back opening 62 into the receiving chamber 61 inside the cover shell 60, permitting the cushion means 50 to be stopped at the back side of the front wall 63 of the cover shell 60, and then the cover shell 60 is mounted into the opening 11 of the housing 10 and secured in place by forcing the backward hooks 65 of the cover shell 60 into engagement with the periphery of the opening 11 of the housing 10 and stopping the elongated flanges 66 outside the side boards 12 of the housing 10. When the electric circuit of the fan means 30 is electrically connected, heat is quickly carried out of the housing 10 by the fan means 30 through the air vents 631 of the cover shell 60.

Figure 3:
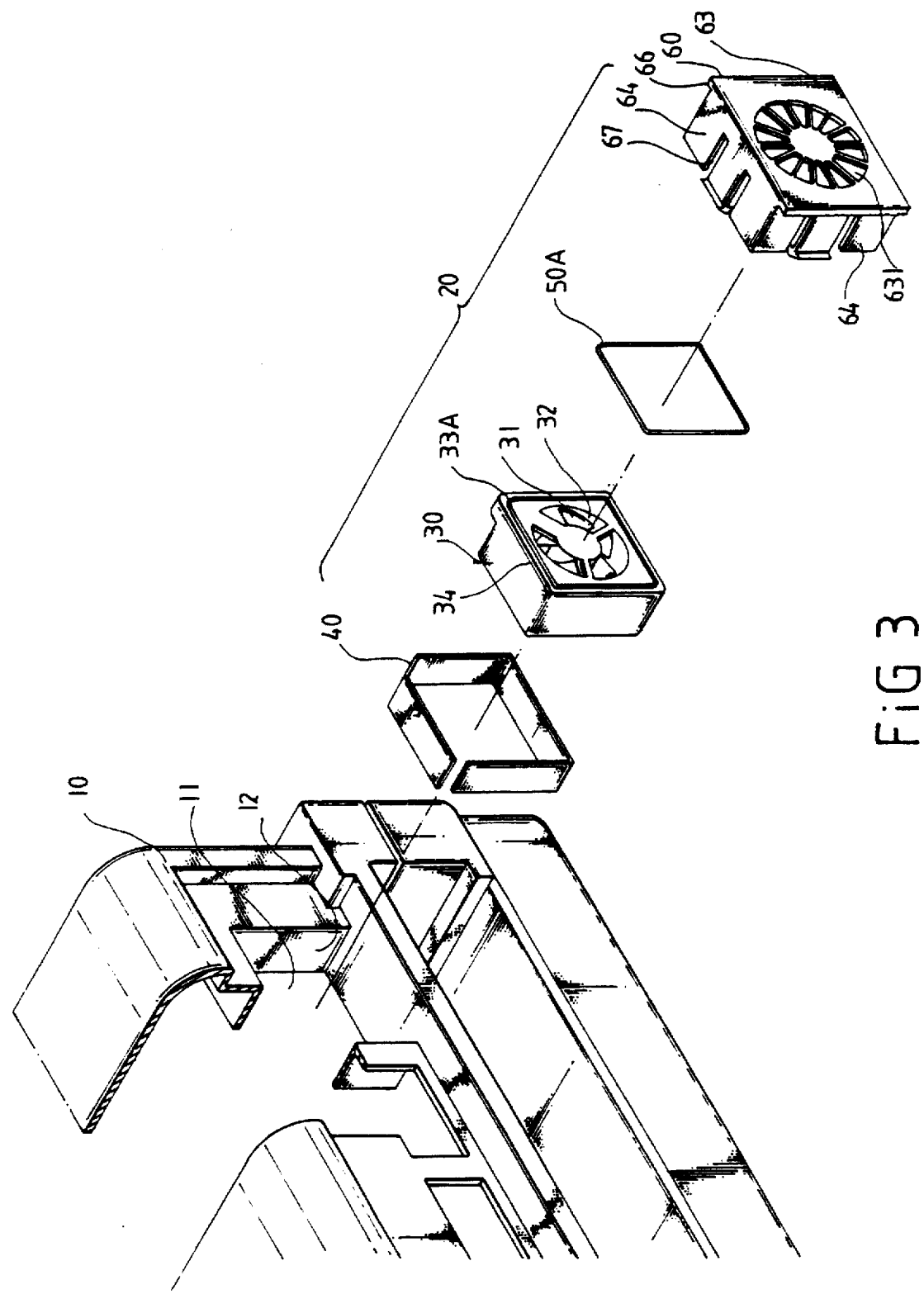
FIG. 3 is an exploded view of an alternate form of the embedded heat dissipating device mounting structure according to the present invention.

FIG. 3 shows an alternate form of the present invention in which, the parallel side boards 12 are perpendicularly and inwardly raised from two opposite sides of the opening 11; the casing 34 of the fan means has an endless mounting groove 33A along the border; the cushion means 50A is an endless rubber mounted within the endless mounting groove 33A and stopped between the casing 34 of the fan means and the cover shell 60 to absorb shock waves.

It is to be understood that the drawings are designed for purposes of illustration only, and are not intended as a definition of the limits and scope of the invention disclosed.

What the invention claimed is:

1. An embedded heat dissipating device mounting structure comprising a housing for an electronic instrument, said housing having an opening and two parallel side boards perpendicularly raised from the periphery of the opening at two opposite sides, and a heat dissipating device mounted in the opening of said housing and secured to said parallel side boards and operated to carry heat out of said housing, said heat dissipating device comprising a fan means controlled to cause currents of air for carrying heat away from said housing, and a cover shell covered on said fan means and secured to the side boards of said housing, said cover shell comprising a receiving chamber at a back side thereof which receives said fan, a front wall at a front side thereof, a plurality of air vents through said front wall, two opposite pairs of parallel side walls perpendicularly and backwardly raised from the border of said front wall, a plurality of springy backward hooks respectively formed in said parallel side walls and adapted for hooking on the side boards of said housing at an inner side, and two elongated flanges respectively raised from the border of said front wall at two opposite sides and adapted for stopping against the side boards of said housing at an outer side.

2. The embedded heat dissipating device mounting structure of claim 1 wherein the side boards of said housing are outwardly raised from the periphery of the opening of said housing at two opposite sides.

3. The embedded heat dissipating device mounting structure of claim 1 wherein the side boards of said housing are inwardly raised from the periphery of the opening of said housing at two opposite sides.

4. The embedded heat dissipating device mounting structure of claim 1 wherein said fan means comprises a casing having groove means at a front side thereof, and cushion means mounted in said groove means and stopped against the front wall of said cover shell to absorb shock waves.

5. The embedded heat dissipating device mounting structure of claim 4 wherein said groove means comprises a plurality of corner grooves in corners of said casing at the front side, and said cushion means is comprised of a plurality of plug-like cushions respectively mounted in said corner grooves.

6. The embedded heat dissipating device mounting structure of claim 4 wherein said groove means comprises an endless groove at the front side along the border, and said cushion means is an endless cushion mounted in said endless groove.

7. The embedded heat dissipating device mounting structure of claim 1 further comprising a plurality of grooved elastic pads respectively adhered to the periphery of said fan means and disposed inside said cover shell.

\* \* \* \* \*